United States Patent [19]

Morris et al.

[11] 4,255,694

[45] Mar. 10, 1981

[54] POWER AMPLIFIER WITH POWER MONITOR CIRCUIT

[75] Inventors: Lyle E. Morris, Newark; Kai C. K. Sun, Saratoga, both of Calif.

[73] Assignee: Xerox Corporation, Stamford, Conn.

[21] Appl. No.: 63,639

[22] Filed: Aug. 2, 1979

[51] Int. Cl.³ ............................................. G05B 23/02
[52] U.S. Cl. .................................... 318/565; 318/432; 330/298; 361/30
[58] Field of Search ........................ 361/24, 30, 31, 33; 318/432, 565, 590, 341; 330/298

[56] References Cited

U.S. PATENT DOCUMENTS

| | | | |
|---|---|---|---|
| 3,378,699 | 4/1968 | Bruinsma et al. | 307/241 |
| 3,422,326 | 1/1969 | White et al. | 318/599 |
| 3,471,759 | 10/1969 | Broverman | 318/681 |
| 3,525,029 | 8/1970 | Joslyn et al. | 318/599 |
| 3,538,353 | 11/1970 | Hanger | 307/255 |
| 3,588,650 | 6/1971 | Bevis | 318/341 X |
| 3,686,577 | 8/1972 | Futamura | 318/599 |
| 3,990,020 | 11/1976 | Porter | 330/298 X |
| 4,030,012 | 6/1977 | Buhler | 318/565 |
| 4,146,801 | 3/1979 | Vali et al. | 361/33 X |

OTHER PUBLICATIONS

Electronic Motor Control, A. Lytel, Howard W. Sams & Co., Oct. 1964.

Primary Examiner—B. Dobeck
Attorney, Agent, or Firm—Barry Paul Smith

[57] ABSTRACT

A power amplifier is disclosed for controlling the current flow through a load. The power amplifier includes a plurality of switching elements connected in bridge fashion with the load and a first predetermined power source for coupling the load across alternate output terminals of the power source in accordance with the levels of a plurality of control signals respectively applied to the plurality of switching elements. Circuitry is coupled to a second predetermined power source for generating the control signals. Logic circuitry, when enabled, is capable of coupling each of the control signals to the respective switching element. A power monitor circuit compares the voltage level of the second power source with a predetermined reference potential and generates a current disable signal when the voltage level is less than the reference potential. A disable circuit coupled to the power monitor circuit disables the coupling circuit in response to the presence of the current disable signal whereby further current flow through the load is inhibited.

4 Claims, 15 Drawing Figures

POWER AMPLIFIER WITH POWER MONITOR CIRCUIT

BACKGROUND OF THE INVENTION

This invention relates to power amplifiers for controlling the current flow through a load, such as a d-c servo motor. More particularly, the invention relates to power amplifiers of the type comprising a plurality of switching elements connected in bridge fashion with the load and a predetermined power source for coupling the load across alternate output terminals of the power source in accordance with the levels of a plurality of control signals respectively applied to the plurality of switching elements.

Switching power amplifiers of the bridge type normally include diagonally opposed power switching elements which are caused to conduct current through the load (e.g., motor) in a given direction, with one set of diagonally opposed elements causing motor current flow in a forward direction, and the remaining set of diagonally opposed elements allowing motor motor current flow in the reverse direction. By controlling the conducting intervals of the sets of diagonally opposed switching elements, current flow through the motor can be proportionally controlled. Exemplary bridge type switching power amplifiers employing pulse width modulation (PWM) techniques are disclosed in U.S. Pat. Nos. 3,422,326, 3,471,759 and 3,525,029, and an exemplary so-called "free-running" bridge type switching power amplifier is disclosed in now abandoned U.S. application No. 684,522 filed on May 10, 1976 in the names of Frank D. Ruble et al for CONSTANT CURRENT POWER AMPLIFIER and assigned to the assignee of the present invention.

The plurality of control signals for respectively controlling the states of the plurality of switching elements are normally generated by circuitry which is connected to a predetermined source of power. Oftentimes, a "glitch" or unexpected loss of power may occur which may alter the levels of the control signals and thus the states of the switching elements. This may, in turn, lead to imprecise load control, and possibly even damage to the load.

It would be desirable, therefore, to provide in a switching power amplifier of the bridge type a means of detecting a glitch in the power supply and for inhibiting the current flow through the load in response to a detected glitch. It would further be desirable if the current flow were inhibited only if and when the glitch, or power supply reduction, was the result of a voltage reduction below a predetermined reference potential for at least a first predetermined time duration, so as to avoid unnecessary shut downs caused by electrostatic noise and the like.

It would also be desirable if, once the glitch in the power supply ceases by the power supply voltage returning to a desired level, resumed controlled current flow through the load is delayed for at least a second predetermined time duration. This will insure that the overall system of which the power amplifier is a part is allowed to stabilize following cessation of the glitch prior to resumption of controlled current flow through the load. This is especially important where the monitored power supply also is coupled to other portions of the system for supplying power thereto.

It would further be desirable if the power amplifier could inhibit initial controlled current flow through the load for a third predetermined time interval following initial power-on of the system, thereby further enabling the system to fully stabilize prior to initial controlled current flow through the load.

SUMMARY OF THE INVENTION

In accordance with the invention, a power amplifier for controlling the current flow through a load is provided comprising a plurality of switching elements connected in bridge fashion with the load and a first predetermined power source for coupling the load across alternate output terminals of the first predetermined power source in accordance with the levels of a plurality of control signals respectively applied to the plurality of switching elements; generating means operatively coupled to a second predetermined power source for generating the control signals; coupling means capable when enabled of coupling each of the control signals from the generating means to the respective switching element for controlling same; power monitor means for comparing the voltage level of the second predetermined power source with a predetermined reference potential and for generating a current disable signal when the voltage level is less than the predetermined reference potential; and disable means coupled to the power monitor means and responsive to the current disable signal for disabling the coupling means whereby further current flow through the load is inhibited.

In accordancae with a further aspect of the invention, the power monitor means comprises a threshold detector including means for comparing the voltage level of the second predetermined power source with the predetermined reference potential and for generating a detect disable signal when and for so long as the voltage level is less than the predetermined reference potential; and a duration detector coupled to the threshold detector and responsive to the detect disable signal for detecting the time duration of the detect disable signal and for generating the current disable signal if the duration of the detect disable signal exceeds a first predetermined time duration.

In accordance with yet another aspect of the invention, the power monitor means comprises means for maintaining the current disable signal true for at least a second predetermined delay interval following return of the voltage level to a level equal to or greater than the predetermined reference potential.

In accordance with still another aspect of the invention, the power monitor means further comprises means for maintaining the current disable signal true for a third predetermined delay interval upon initial turn on of the second predetermined power source.

These and other aspects and advantages of the present invention will be described in more detail below with reference to the accompanying drawings.

DESCRIPTION OF THE PREFERRED EMBODIMENT

Figure 1:
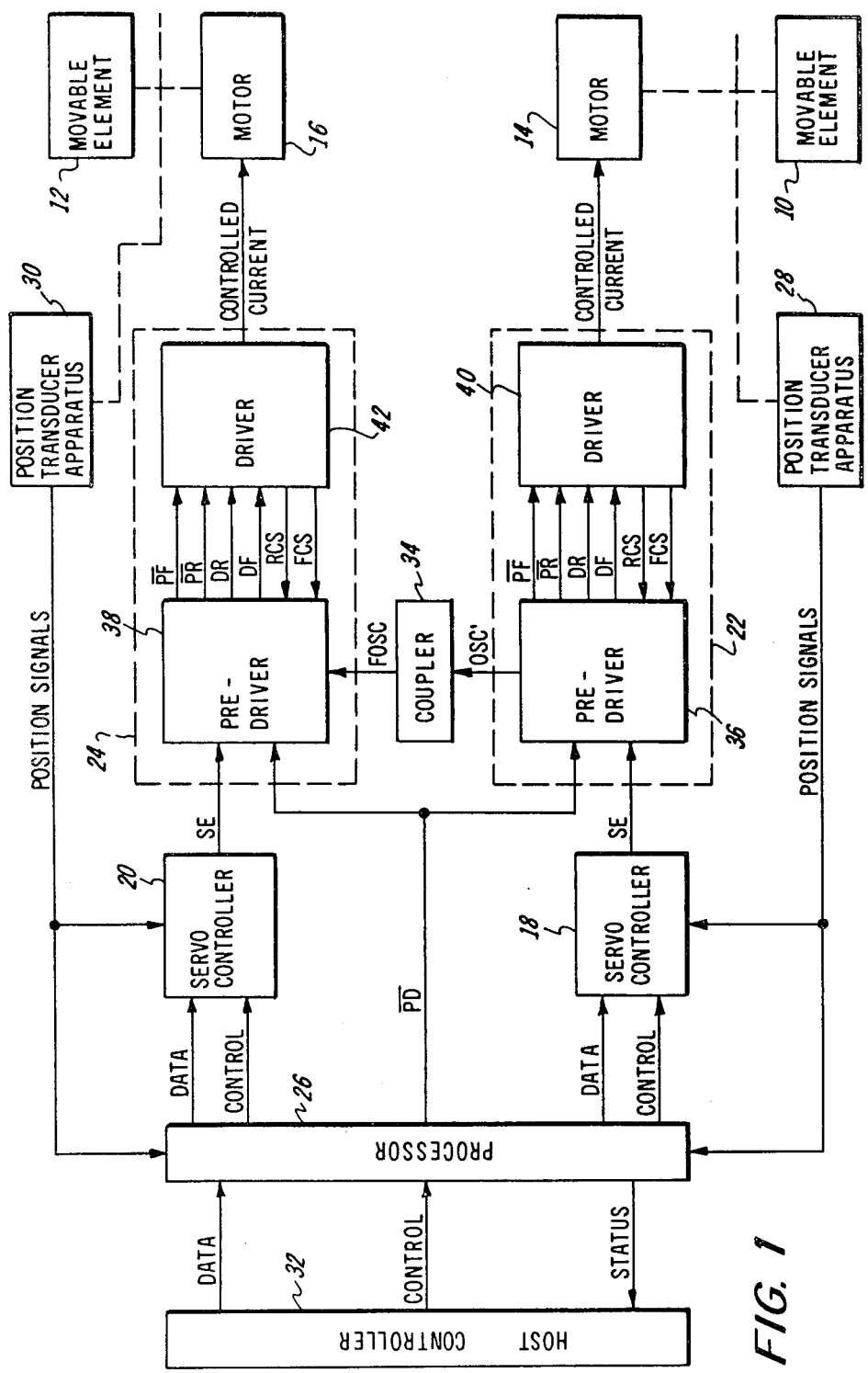
FIG. 1 is a block diagram representation of a system for controlling the movements of a pair of movable elements.

Referring to FIG. 1, a control system is shown for controlling the movements of a plurality of movable elements, such as a pair of movable elements 10 and 12. The controlled system includes a pair of motors 14 and 16 respectively connected to the movable elements 10 and 12 for directly driving the movements thereof. The control system includes a pair of servo controllers 18 and 20 for developing a pair of servo error (SE) signals in a manner to be described below. The servo error signals are applied to a respective pair of power amplifiers 22 and 24 which then develop controlled current flow through the motors 14 and 16 in a manner also to be described below.

The servo controllers 18 and 20 each receive command data and control signals from a processor 26, as well as position feedback signals from a pair of position transducer apparatus 28 and 30 respectively connected to the movable elements 10 and 12. The position signals supplied from each position transducer apparatus 28 and 30 are typically triangular signals having a frequency proportional to the speed of movement of the respective movable element 10 and 12. The pulse train derived from each position signal may be counted by the processor 26 to sense distances of movement of each movable element. The command data typically received by each servo control system may include the distance to travel of each movable element to a new desired location. This data may be supplied initially from a host controller and then updated by the processor 26 in response to the position signals from the respective position transducer apparatus. Alternately, the host controller 32 may just provide the processor 26 with data as to the new desired location of one or both movable elements 10 and 12. In this event, the processor 26, knowing the old position of the movable element, could calculate an initial distance to travel value and then update it in the above manner. As is conventional, the host controller 32 also supplies control signals to the processor 26 which then decodes and forwards appropriate control signals to the servo control systems 18 and 20. Typically, the processor 26 also provides status signals back to the host controller 32.

The servo controllers 18 and 20 may be of any conventional type which respond to the data and control signals from the processor 26 and to the position signals from the position transducer apparatus 28 and 30, respectively, for generating the servo error output signals. For example, each servo control system 18 and 20 may be of the well-known "dual-mode" type which derives an actual velocity signal from the feedback position signals and compares the actual velocity signal with a command velocity signal derived from the distance to travel command data supplied by the processor 26. This comparison represents the first mode of servo operation. When each movable element 10 and 12 is advanced to within a predetermined distance of a new desired position, the respective servo control system switches to a second mode and compares the feedback position signals with the actual velocity signal derived therefrom.

An example of a control system including all of the basic components disclosed in FIG. 1, but not the specific power amplifiers of the present invention to be described below, is disclosed in U.S. Pat. No. 4,091,911 in the form of a control system for controlling the movements of a print wheel and supporting carriage of a serial impact printer.

In accordance with specific aspects of the power amplifiers 22 and 24 to be described below, the control system of FIG. 2 further includes an a-c coupler 34 for coupling an oscillator signal (OSC') developed by the power amplifier 22 to the power amplifier 24 to thereby "slave" the power amplifier 24 to the power amplifier 22. Additionally, the processor 26 is capable of generating a processor-disable ($\overline{PD}$) signal (low true) when it is desired to inhibit further current flow through the motors 14 and 16. In this respect, the $\overline{PD}$ signal is applied to each power amplifier 22 and 24.

Figure 2A:
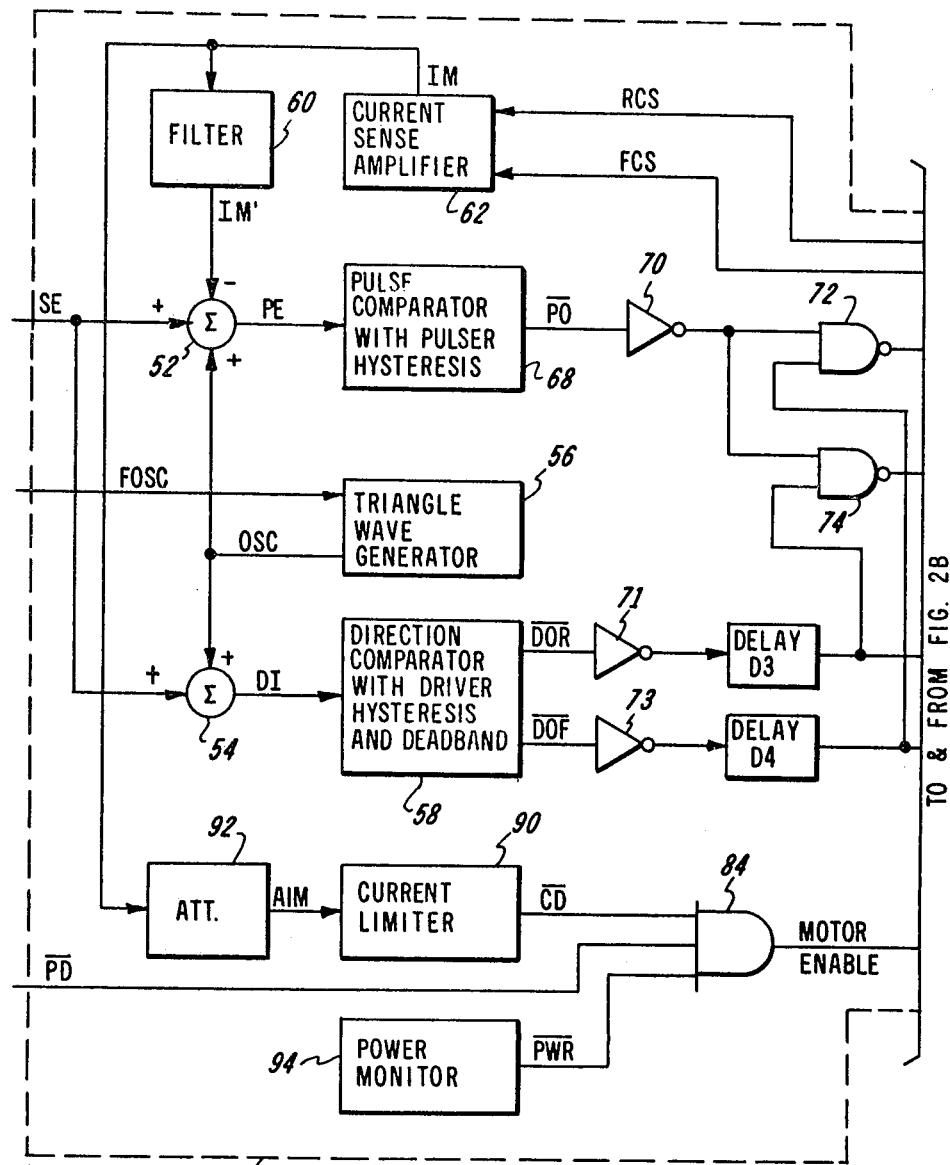
FIG. 2A and 2B are block diagram representations of one of the power amplifiers shown in FIG. 1.
Figure 2B:
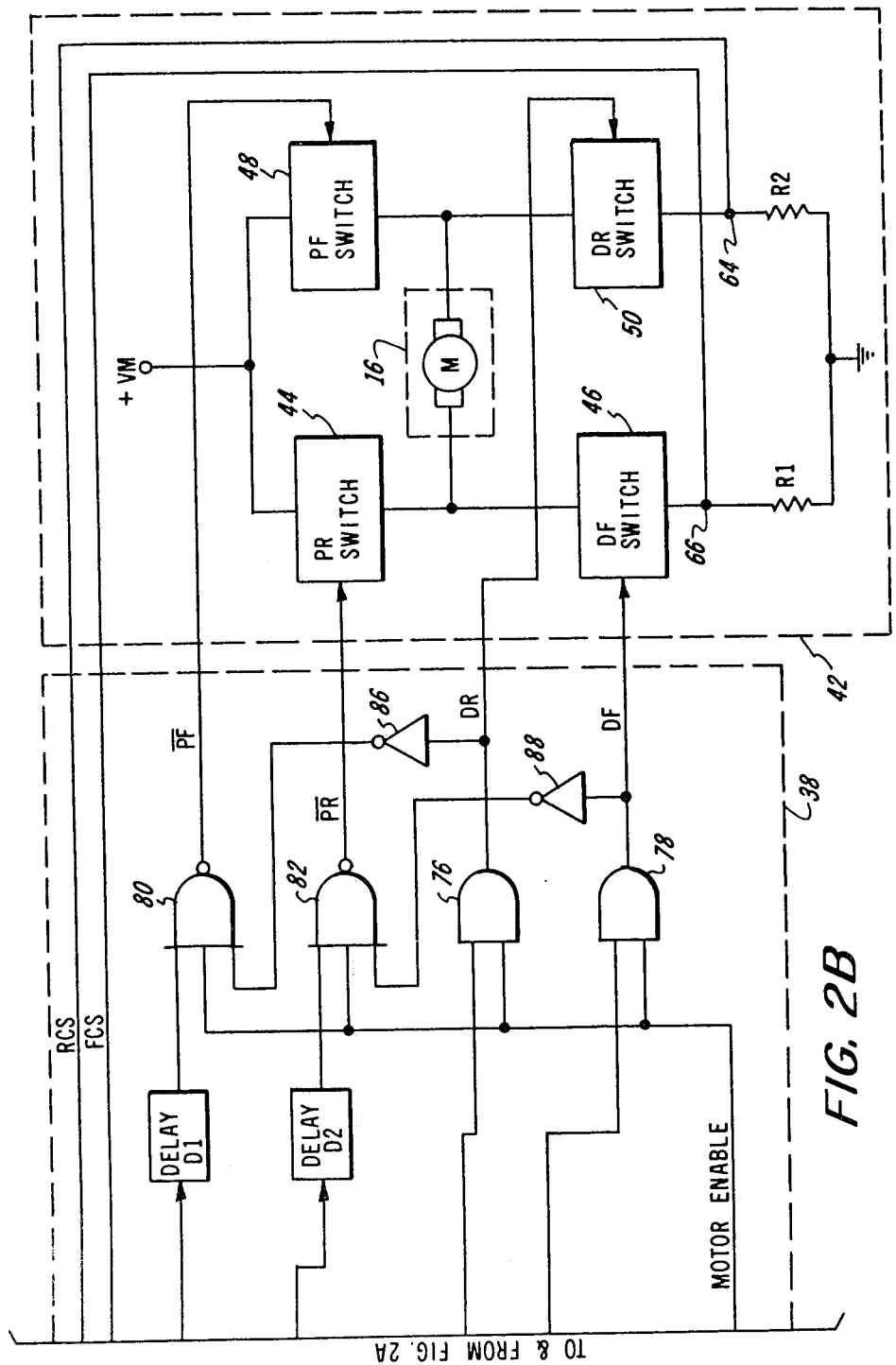

Reference is now had to FIGS. 1 and 2 where the power amplifiers 22 and 24 will be described in more detail below. FIG. 2 actually discloses only the slaved power amplifier 24. However, with the exception of the manner in which an oscillator signal employed in each power amplifier is developed, the power amplifiers 22 and 24 are otherwise identical. Accordingly, both will be described in detail with reference to the slave amplifier 24. Distinctions relative to the oscillator signal will be described below with reference to FIG. 3.

As shown in FIG. 1, the power amplifiers 22 and 24 each comprise an input stage (pre-driver circuits 36 and 38) and an output stage (driver circuits 40 and 42). Each pre-driver circuit 36 and 38 includes means responsive to the servo error (SE) input signal for providing four control signals $\overline{PF}$, $\overline{PR}$, DR and DF at its output to control the states of four switching elements 44, 46, 48 and 50 (FIG. 2) included in the respective driver circuit 40 and 42. Each driver circuit 40 and 42 includes means for detecting both forward and reverse current flow through the respective motor 14 and 16 and for applying current feedback signals RCS (reverse current sense) and FCS (forward current sense) to the respective pre-driver circuit 36 and 38.

Referring now specifically to FIG. 2, the driver circuits 40 and 42, which are identical, will be described with respect to the driver circuit 42 of the slave power amplifier 24. As shown, the driver circuit 42 includes the four switching elements 44–50 which are connected in bridge fashion with the respective motor 16 and a predetermined power source consisting of a supply voltage +VM and a pair of matched resistors R1 and R2 coupled to ground. The switching element 44 is coupled between the supply voltage +VM and the left end of the motor 16 and is designated as the pulser reverse (PR) switching element of the bridge. It is controlled by the state of the $\overline{PR}$ signal applied thereto from the pre-driver circuit 38. A diagonally opposed switching element 50, designated the driver reverse switching elment 50, is coupled between the right end of the motor 16 and ground through the resistor R2. It is controlled by the state of the DR signal applied thereto from the pre-driver circuit 38. When both the $\overline{PR}$ and DR signals are true, the switching elements 44 and 50 will close and define a current path from voltage source +VM through PR switch 44, motor 16, DR switch 50 and resistor R2 to ground, thereby driving the motor 16 in a reverse direction at a speed proportional to the level and duration of current flow.

Correspondingly, the switching element 48, designated the pulser forward (PF) switching element, is coupled between the voltage source +VM and the right end of the motor 16 and is controlled by the state of the PF control signal applied thereto from the pre-driver circuit 38. Finally, the diagonally opposed switching element 46, designated driver forward (DF) switching element, is coupled between the left end of the motor 16 to ground through the resistor R1. Consequently, when both the $\overline{PF}$ and DF control signals are true, the switching elements 48 and 46 will close and define a current path from voltage source +VM through PF switch 48, motor 16, DF switch 46 and resistor R1 to ground, thereby driving the motor 16 in a forward direction at a speed once again proportional to the level and duration of current flow through the motor 16.

Figure 15:
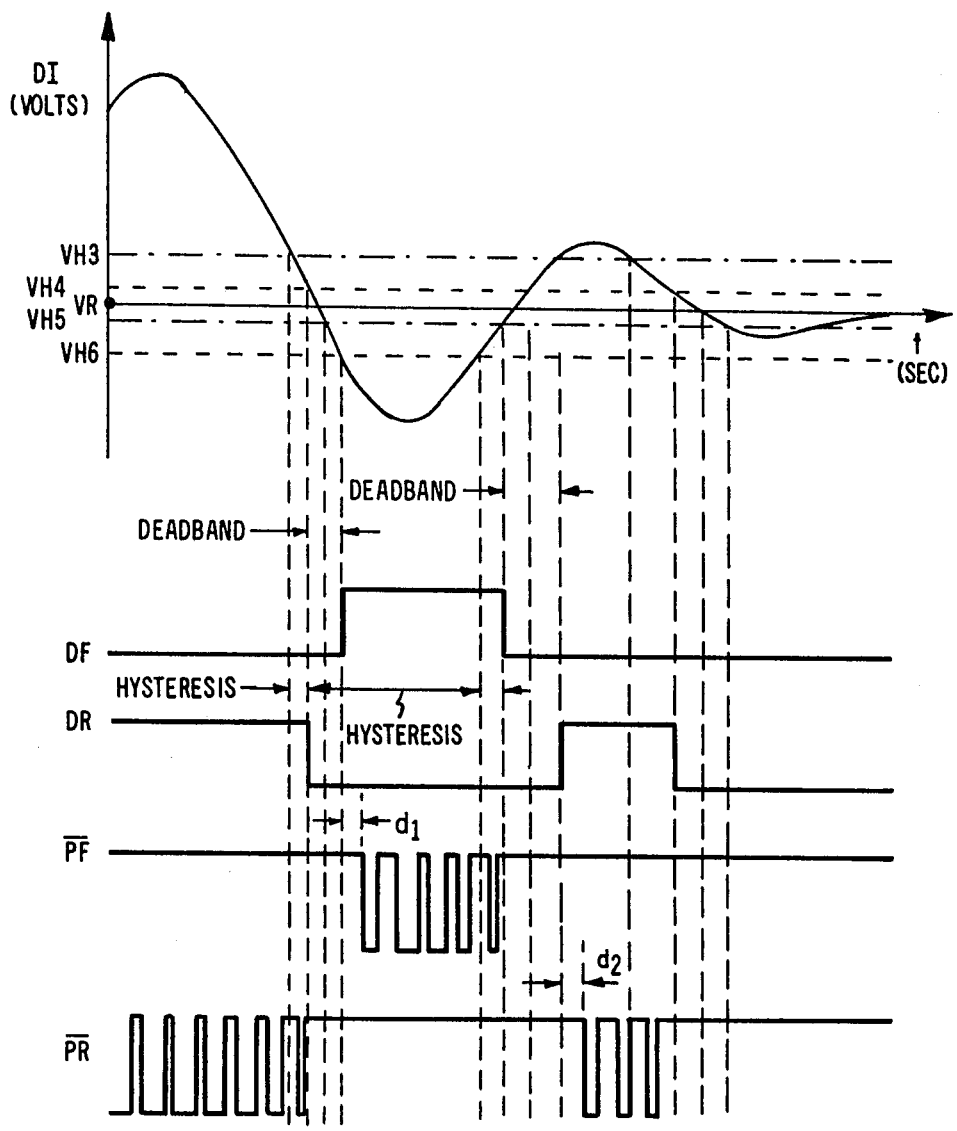
FIG. 15 are waveforms of the servo error (SE) input to the power amplifiers of FIG. 1 and the output signals PF, PR, DF and DR of the power amplifiers.

The switching elements 44–50 may be any suitable switches, such as transistor switches, capable of closing in response to receipt of a true control signal applied thereto and opening when the control signal goes false. The control signals $\overline{PF}$ and $\overline{PR}$ are preferably pulse width modulated pulse trains generated by the pre-driver circuit 38 in a manner to be described below. Exemplary waveforms of all four control signals $\overline{PF}$, $\overline{PR}$, DF and DR and of the servo error signal SE are shown in FIG. 15 and will also be described in more detail below.

Still referring to FIG. 2, the pre-driver circuit 38 includes a pair of summing circuits 52 and 54, each having one input for receiving the servo error (SE) signal from the servo controller 20 (FIG. 1). A second input of each of the summing circuits 52 and 54 is adapted to receive an oscillator signal (OSC) in the form of a triangular wave of predetermined frequency, preferably 23 KHz generated by a triangle wave generator 56 to be described in more detail below with reference to FIG. 3. As shown in FIG. 4, the tirangle wave oscillator signal (OSC') developed by the pre-driver 36 (FIG. 1) of the master power amplifier 22 and from which the triangle wave generator 56 derives the OSC signal, has an effective "zero-crossing" at a predetermined reference potential +VR, which is desirably +12.5 volts, and positive and negative peaks at V$_{(max)}$ and V$_{(min)}$, which are desirably at +15.0 volts and +10.0 volts, respectively. The summing circuit 54 sums the OSC and SE signals and supplies the resultant direction input (DI) signal to a direction comparator with hysteresis and deadband circuit 58.

The summing circuit 52 has yet another input for receiving a filtered actual motor current signal (−IM') from the output of a filter circuit 60. The filter 60 essentially filters out high frequency noise spikes developed in an actual motor current signal (IM) developed at the output of a current sense amplifier 62. The current sense amplifier 62 is preferably a differential amplifier which responds to the difference between a reverse motor current signal (RCS) as sensed by the voltage level at point 64 in the driver circuit 42, and a forward motor current signal (FCS) as sensed by the voltage level at point 66 in the driver circuit 42. The summing circuit 52 therefore sums the SE and OSC signals with the −IM' signal from the filter circuit 60 and supplies a resultant pulser error (PE) signal to a pulse comparator with pulser hysteresis circuit 68.

The pulse comparator with pulser hysteresis circuit 68 has two main purposes. The first is to compare the pulser error (PE) signal representative of the sum of the SE, the OSC signals and the −IM' current feedback signal with the reference voltage source +VR and to generate a pulser output ($\overline{PO}$) signal representative of such comparison. More specifically, the $\overline{PO}$ signal will be true whenever and for so long as the pulser error (PE) signal exceeds the reference voltage +VR. In view of the use of the triangle wave generator 56 with its OSC signal output summed with the servo error (SE) signal, the $\overline{PO}$ signal will be a pulse-width-modulated pulse train, as is conventional. The $\overline{PO}$ signal is used to derive the $\overline{PF}$ and $\overline{PR}$ control signals alluded to earlier. A second purpose of the circuit 68 is to establish both d-c and a-c hysteresis in the $\overline{PO}$ signal, where the d-c hysteresis is used to avoid noise and the a-c hysteresis is used to reduce excessive swithcing power dissipation in the switching elements 44–50. The preferred pulse comparator with pulser hysteresis circuit will be described in detail below in connection with FIGS. 5 and 6.

The direction comparator with driver hysteresis and deadband circuit 58 also has two main purposes. The first is to compare the direction input (DI) signal, which is the sum of the SE and OSC signals, with the reference voltage +VR and to generate a pair of direction output signals ($\overline{DOR}$ and $\overline{DOF}$) representative of such comparison. More particularly, if the direction input (DI) signal is less than the reference voltage +VR, then the $\overline{DOF}$ (direction output forward) signal goes true (low) to signify that forward motor current is required. On the other hand, if the DI signal exceeds references voltage +VR, then the $\overline{DOR}$ (direction output reverse) signal goes true (low) to signify that reverse motor current is required. The $\overline{DOR}$ signal is used to control the derivation of the $\overline{PR}$ control signal from the $\overline{PO}$ signal and is itself used to derive the DR control signal. Likewise, the $\overline{DOF}$ signal is used to control the derivation of the $\overline{PF}$ control signal from the $\overline{PO}$ signal and is itself used to derive the DF control signal. The specific manner by which this is accomplished will be described below.

A second purpose of the direction comparator with driver hysteresis and deadband circuit 58 is to establish in the $\overline{DOR}$ and $\overline{DOF}$ output signals sufficient d-c and a-c hysteresis to avoid noise and reduce excessive switching power disipation in the switching elements 44–50, as is the case with the hysteresis injected into the $\overline{PO}$ signal from the pulse comparator with pulser hysteresis circuit 68. Additionally, however, the circuit 58 includes means to be described below for defining a first deadband period when the voltage level of the SE signal is changed from positive to negative with respect to the reference voltage +VR, and a second deadband period when the voltage level of the SE signal is changed from negative to positive with respect to such reference signal. During each deadband period, the signals $\overline{DOR}$ and $\overline{DOF}$ will be false (high), thereby insuring that all four switching elements 44–50 will be off. This insures that all four switching elements will not be on at the same time during the condition of a reltively slow changing SE signal, such as depicted in FIG. 15. Other delay circuits D3 and D4 to be described below are effective to create the desired deadband periods for more rapidly changing servo error signals, such as square-waves and the like. Specific details of a preferred direction comparator circuit 58 will be described in more detail below with reference to FIGS. 7 and 8.

Referring still to FIG. 2, the specific manner in which the $\overline{PF}$, $\overline{PR}$, DR and DF control signals are derived from the $\overline{PO}$, $\overline{DOR}$ and $\overline{DOF}$ signals will be described. As shown, the pulser output ($\overline{PO}$) signal is coupled from the pulse comparator circuit 68 through an inverter 70 to a first input of each of two AND-gates 72 and 74. The $\overline{DOR}$ signal is applied through an inverter 71 and a delay circuit D3 to a second input of the AND-gate 74 and to a first input of an AND-gate 76. The $\overline{DOF}$ signal is applied through an inverter 73 and a delay circuit D4 to a second input of the AND-gate 72 and to a first input of an AND-gate 78. The delay circuits D3 and D4 may comprise any convertional delay circuits capable of delaying the DOR and DOF signals at the outputs of inverters 71 and 73 by a predetermined time interval. Preferably, the delay interval defined by each delay circuit D3 and D4 is identical. The purpose of delay circuits D3 and D4 is to define first and second deadband periods as defined above during the case of a fast changing SE signal, where the circuit 58 would not itself produce a deadband of sufficient duration. More specifically, in the case of the relatively slow changing servo error signal depicted in FIG. 15, the deadband periods defined by the delay circuits D3 and D4 would be included in the somewhat longer deadband periods defined by the circuit 58. In faster changing servo error signals, the latter periods would be shorter than the periods created by the delay circuits D3 and D4, which would then be operative to define the desired deadband periods.

Now then, the output of the AND-gate 72 is coupled through another delay circuit D1 to a first input of another NAND-gate 80, and the output of the AND-gate 74 is coupled through yet another delay circuit D2 to a first input of another NAND-gate 82. Accordingly, a true (high) pulser forward signal will be developed at the output of the AND-gate 72 when both inputs are high. Similarly, a true (high) pulser reverse signal will be developed at the output of the AND-gate 74 when both inputs are high.

A second input of each of the gates 76, 78, 80 and 82 is connected to the output of a motor enable AND-gate 84. The purpose of the gate 84 will be described in more detail below. At this time, however, it should be noted that when the output of the gate 84 is true (high), all four gates 76, 78, 80 and 82 will be enabled. A third input of each of the NAND-gates 80 and 82 is coupled through respective inverters 86 and 88 to the outputs of the AND-gates 76 and 78, respectively.

It should be noted with reference to FIG. 15 that the purpose of delay circuit D1 is to delay the commencement of pulsing by the control signal $\overline{PF}$ until after the control signal DF goes true. Similarly, the purpose of delay circuit D2 is to delay the commencement of pulsing by the control signal $\overline{PR}$ until after the control signal DR goes true. Preferably, all four delay circuits D1–D4 have the same time delay.

In operation, let us first assume that the motor enable signal is true (high), therby enabling all four gates 76, 78, 80 and 82. Let us further assume that the motor 16 is initially at rest and it is desired to increase the reverse speed by an amount indicated by a positive servo error (SE) signal, such as shown in FIG. 15. The summation of SE, OSC and —IM' will initially produce a low output signal ($\overline{PO}$) at the output of circuit 68 which will be inverted at the output of inverter 70 and applied to the first inputs of AND-gates 72 and 74. When the actual motor current signal —IM' appraoches the desired current level, the output signal $\overline{PO}$ will become pulse-width modulated.

The summation of the SE and OSC signals will produce a true (high) DOR output signal and a false (low) DOF output signal at the outputs of inverters 71 and 73, respectively. The output of delay circuit D3 will then go high after the time delay thereof to enable gate 74 to pass the PWM pulse train of signal $\overline{PO}$ from the output of inverter 70. The output of delay circuit D4 will remain low, thereby disabling gate 72, i.e., the output thereof will remain low. The PO signal from the output of AND-gate 74 will then be delayed by delay circuit D2 and applied to the first input of NAND-gate 82. In our example, the second input connected to AND-gate 84 will be high. The third input connected to the output of inverter 88 will be high since the output of delay circuit D4 and thus AND-gate 78 will be low. Consequently, the PO signal, inverted now as the control signal $\overline{PR}$, will be applied to PR switching element 44 to control the switching thereof. At the same time, the high output of the delay circuit D3 will be applied through the AND-gate 76, since the other input thereof connected to the AND-gate 84 will be high, to the DR switch 50 to turn it on. Initially, increasing reverse current will flow through the motor 16 from voltage source +VM through PR swich 44, motor 16, DR swithc 50 and resistor R2 to ground. When the motor current approaches the desired level, the now pulse-width-modulated $\overline{PO}$ output signal will cause the motor current to oscillate about the desired level at the frequency of the OSC signal. The PF switch 48 will be maintained off since the output of inverter 86 will be low, thereby holding the $\overline{PF}$ output of gate 80 high (false). Further, the DF switch 46 will be maintained off since the low output of delay circuit D4 will cause a low DF signal at the output of gate 78.

Now then, when the movable element 12 controlled by the motor 16 reaches the desired position, it may overshoot whereby the SE signal will go negative, as shown in FIG. 15. This will necessitate the application of forward motor current to correct the overshoot. The now negative SE signal will cause the DOF signal to go high and the DOR signal low, thereby having the reverse effect as described above and enabling the $\overline{PO}$ signal to be inverted by the gate 80 and applied as the control signal $\overline{PF}$ to the PF switch 48 to control same. Correspondingly, the DF switch 46 will be enabled by a high DF signal from the output of gate 78. Additionally, the PR switch 44 and DR switch 50 will be held off. This same result can be achieved initially by applying a negative servo error SE signal to the summers 52 and 54 when it is desired to drive the motor 16 in a forward direction.

As alluded to above, the establishment of deadband periods insures that all four switching elements 44, 46, 48 and 50 are maintained off for the period of the deadband during transitions from reverse to forward motor control and visa-versa. Also, it will be appreciated from the above operation description that merely the single pair of inverters 86 and 88 serve to provide a simple and effective fail-safe system against the cross-firing of the switching elements, i.e., two switching elements on the same side of the bridge being on at the same time. Thus, when the DR signal is true (high), the inverter 86 will disable gate 80, keeping the $\overline{PF}$ signal high (false). Similarly, when the DF signal is true (high), the inverter 88 will disable gate 82, keeping the $\overline{PR}$ signal high (false).

What remains to be discussed relative to FIG. 2 is the purpose of gate 84 and the manner in which the various inputs applied thereto are generated. As indicated above, the MOTOR ENABLE signal at the output of the gate 84, when true (high), enables the four gates 76, 78, 80 and 82. Correspondingly, when the MOTOR ENABLE signal is false, all four gates 76, 78, 80 and 82 will be disabled in order to hold each of the four control signals $\overline{PF}$ $\overline{PR}$, DF and DR false. This will then prevent current flow in either direction through the motor 16.

As shown in FIG. 2, the AND-gate 84 has three inputs. A first input is connected to the output of a current limiter circuit 90 for receiving a current limit not ($\overline{CD}$) signal therefrom. The current limiter circuit 90 receives at its input an attenuated motor current feedback signal (AIM) from the output of an attenuator 92. The attenuator includes circuitry to be described below for attenuating the level of the current feedback signal IM developed at the output of the current sense amplifier 62. The current limiter 90 includes circuitry also to be described below for comparing the level of the AIM signal with predetermined upper and lower current limit signals developed internally of the current limiter 90. If the AIM signal falls outside either limit, indicating that the actual current level through the motor falls outside certain minimum and maximum limits, the $\overline{CD}$ signal goes true (low), thereby causing the MOTOR ENABLE signal to go false (low), thereby disabling the gates 76, 78, 80 and 82. The current limiter 90 will be described in more detail below with reference to FIG. 9.

A second input of the AND-gate 84 is connected to the processor 26 (FIG. 1) for receiving the processor disable not ($\overline{PD}$) signal therefrom. The processor will generate a true (low) $\overline{PD}$ signal when it desires to disable current flow through the motor 16 (or motor 14 in the case of power amplifier 22, which is identical to power amplifier 24 except for the generation of the triangle wave oscillator signals, as indicated above). There are many instances in which the processor 26 could be used to automatically disable current flow, such as being responsive to a disable command signal supplied to the processor on a control line from the host controller 32.

The third input of the AND-gate 84 is connected to the output of a power monitor circuit 94 for receiving a power not ($\overline{PWR}$) signal therefrom. The power monitor circuit 94 includes circuitry for holding the $\overline{PWR}$ true (low) for a predetermined period following initial power-on in order to enable the processor 26 and associated servo controller 18 and 20 to stabilize. Further, the power monitor circuit 44 includes circuitry for detecting whether the +VR voltage reference signal contains a "glitch" or sudden drop to a level less than a predetermined amount for greater than a predetermined time interval. If this occurs, the $\overline{PWR}$ signal goes low, thereby disabling further motor current flow. Further, the power monitor circuit 94 includes circuitry for maintaining the $\overline{PWR}$ signal low for a predetermined time interval following removal of the glitch, thereby enabling full stabilization of the system. The power monitor circuit will be described in more detail below with reference to FIGS. 10–14.

Figure 3:
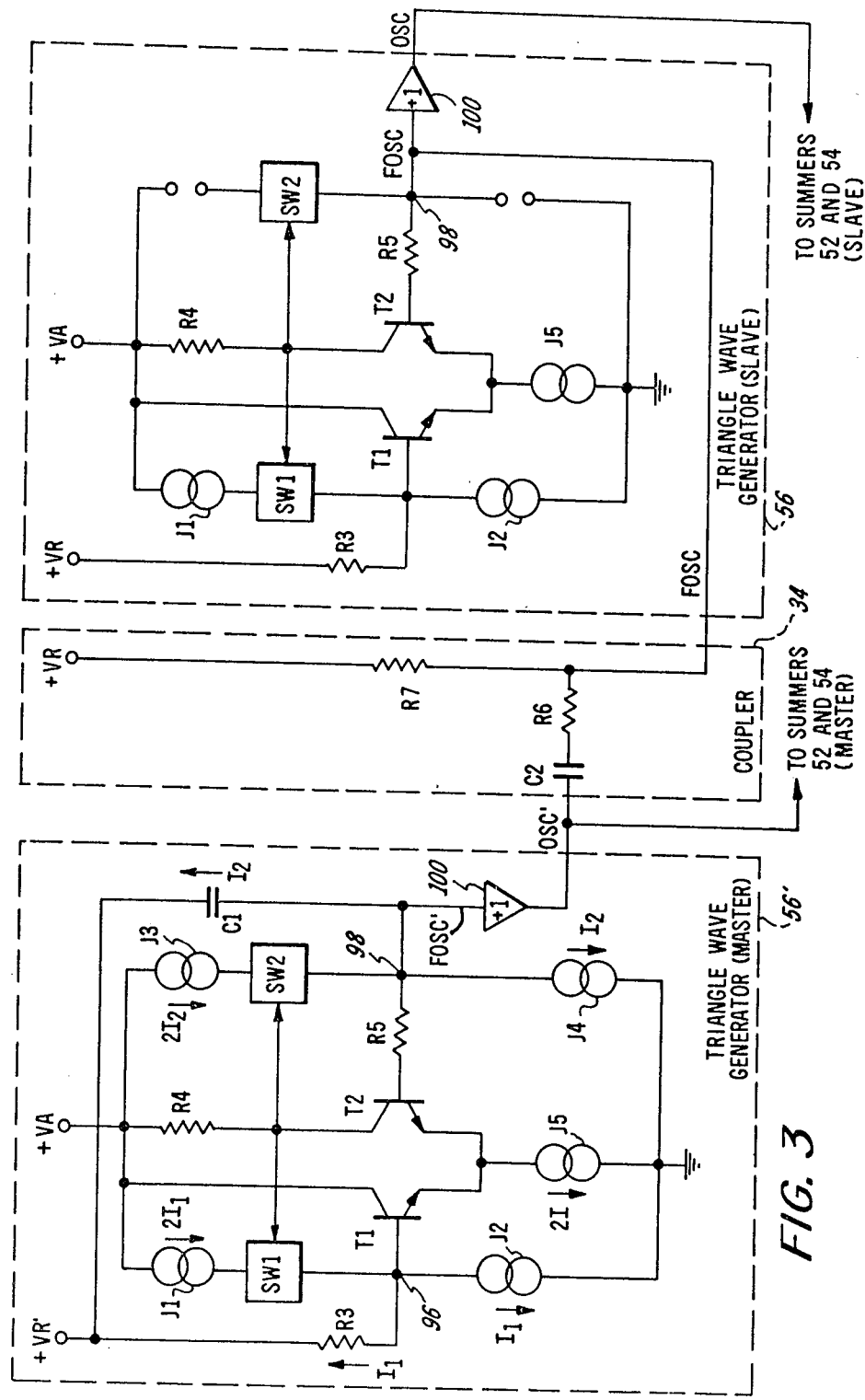
FIG. 3 is a schematic circuit diagram of the triangle wave generator included in each power amplifier shown in FIG. 1, as well as the coupler shown in FIG. 1.
Figure 4:
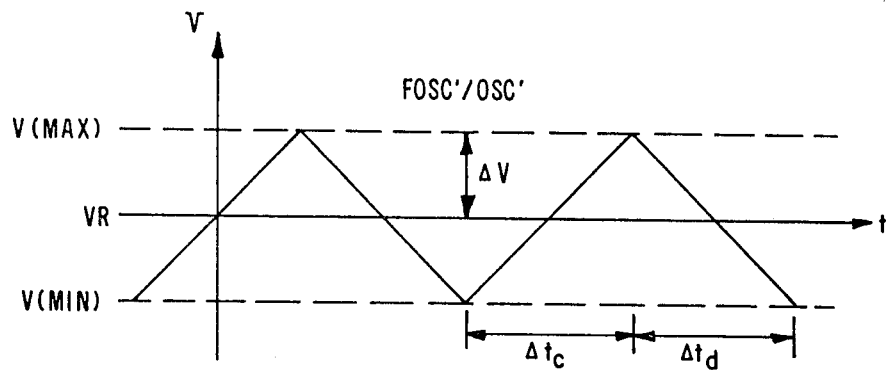
FIG. 4 is a waveform of the FOSC' and OSC' signals generated by a master power amplifier shown in FIGS. 1 and 3.

Reference is now had to FIG. 3, where the triangle wave generators 56 and 56' respectively employed in the power amplifiers 24 and 22 will be described, as will the unique master-slave relationship between these two generators and thus between the power amplifiers themselves. Referring first to the triangle wave generator 56' included in the pre-driver circuit 36 of the master power amplifier 22, such generator includes a first current source J1 coupled at one end to a voltage source +VA (preferably +32 volts) and at another end through a switching element SW1 to a junction point 96. The junction point 96 is coupled through a second current source J2 to ground, through a resistor R3 to a reference voltage +VR' (preferably substantially identical to the +VR reference voltage, e.g., +12.5 volts, alluded to earlier), and to the base electrode of a transistor T1.

The master triangle wave generator 56' further includes a third current source J3 coupled at one end to the voltage source +VA and at another end through a switching element SW2 to a junction point 98. The junction point 98 is also coupled through another current source J4 to ground, through a capacitor C1 to the reference voltage +VR, and through a resistor R5 to the base electrode of another transistor T2. The emitter electrodes of transistors T1 and T2 are coupled through yet another current source J5 to ground. Further, the collector electrode of the transistor T1 is connected to the voltage source +VA and the collector electrode of the transistor T2 is connected to the control inputs of both switching elements SW1 and SW2, and through a resistor R4 to the source voltage +VA. As will be described below, the value of the capacitor C1 defines the frequency of oscillation of the triangle wave output signal FOSC' developed at the junction point 98, and the value of the resistor R3 may be selected to ultimately define the amplitude of the signal FOSC', which is coupled through an output buffer amplifier 100 to the coupler 34.

The triangle wave generator 56' is preferably designed to generate an approximate 23 KHz triangle wave oscillator signal (OSC') so that the power amplifier 22 can operate in a pulse-width-modulation (PWM) mode, as discussed previously. The amplitude of the FOSC' signal is preferably fixed at 5 volts peak-to-peak relative to +VR (12.5 volts).

In operation, when the triangle wave generator 56' is turned on, transistor T2 will begin to turn off. At this time, both switching elements SW1 and SW2 will be on.

Hence, current sources J1 and J3 will respectively provide currents 2I and 2I$_2$ flowing downwardly as shown in FIG. 3. On the right hand side of the triangle wave generator 56', half of the current 2I$_2$ (i.e., current I$_2$) will flow throug current source J4 to ground, while the other half current I$_2$ will flow through the capacitor C1 to reference voltage +VR to charge same. On the left hand side of the generator 56', one-half of the current 2I$_1$ (i.e., I$_1$) flowing through the switching element SW1 is directed through the current source J2 to ground, while the other half current I$_1$ will flow through the resistor R3 to reference voltage +VR'. Then, the base voltage of transistor T1 is increased to:

$$\Delta V_c = I_1 \cdot R3 \text{ volts}$$

In the preferred embodiment, I$_1$=50 ua, I$_2$=76 ua, R3=50 K and C=330 pf, so that:

$$\Delta V_c = 50 \text{ ua} \times 50 \text{ } K = 2.5 \text{ volts}$$

Furthermore, therefore, the charging time is:

$$\Delta t_c = \frac{2V \cdot C1}{I_2} = 21.71 \text{ us}$$

Now then, when capacitor C1 begins to discharge, transistor T2 is turned on and both switching elements SW1 and SW2 will be off. There is then a current I$_2$ discharging from capacitor C1 to ground on the right hand side, and a current I flowing from +VR' through resistor R3 to current source J2 on the left hand side. Hence:

$$\Delta V_d = -I \cdot R1 = -2.5 \text{ volts}$$
$$\Delta t_d = \frac{2 Vd \cdot C1}{I_2} = 21.71 \text{ us}$$

The period is equal to the sum of both t$_c$ and t$_d$. Accordingly, the frequency is:

$$f = \frac{1}{\Delta t_c + \Delta t_d} = 23 \text{ KHz,}$$

which is equal to the desired frequency of oscillation of 23 KHz. The waveform for the oscillator signal FOSC' and thus signal OSC' is shown in FIG. 4.

Still referring to FIG. 3, the output of the buffer amplifier 100, i.e., the oscillator signal OSC', is applied as inputs to both summers 52 and 54 included in the master pre-driver circuit 36, and is also applied through the a-c coupler 34 directly to the output junction 98 of the slave triangle wave generator 56, which is maintained inactive. The coupler 34 preferably includes a capacitor C2 in series with a voltage divider comprised of resistors R6 and R7. These elements have values such that the amplitude of the FOSC signal is approximately 3 volts peak-to-peak, instead of the 5 volts peak-to-peak of the FOSC' signal. The FOSC signal is applied through a buffer amplifier 100 identical to amplifier 100 of master triangle wave generator 56'. The OSC signal output of the buffer amplifier 100 of slave triangle wave generator 56 is thus directly determined by the OSC' signal output of the master generator 56'. The frequencies of OSC' and OSC are identical, only the amplitude is different, due to the voltage divider R6–R7. The triangle wave generator 56 and thus power amplifier 24 are slaved to the triangle wave generator 56' and thus power amplifier 22.

The triangle wave generator 56 is rendered inactive by essentially disconnecting the current sources J3 and J4 thereof. The reason why triangle wave generator 56 essentially duplicates the circuitry of generator 56' is because both generators, with the exception of the resistors R3 and capacitor C1, are implemented on a single Large-Scale-Integrated Circuits (LSI) chip. Accordingly, it would be very easy to switch the roles of generators 56 and 56', if that were desired.

Figure 5:
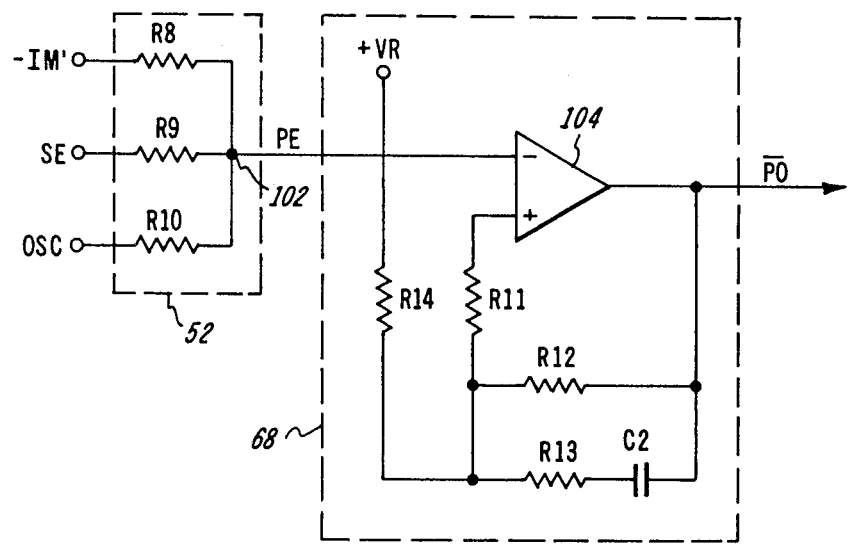
FIG. 5 is a schematic circuit diagram of the pulse comparator and associated input summer shown in FIG. 2.

Reference is now had to FIG. 5 where the summing cirucit 52 and the pulse comparator with pulser hysteresis circuit 68 (FIG. 2) will be described. As shown the summing circuit 52 includes a summing junction 102 coupled through a first resistor R8 to the filter 60 for receiving the current feedback signal $-\overline{IM'}$ therefrom, through a second resistor R9 to the servo controller 20 for receiving the servo error signal SE, and through a third resistor R10 to the triangle wave generator 56 for receiving the oscillator output signal OSC therefrom. The resistors R8-R10 are preferably matched. The pulser error (PE) signal developed at the summing junction 102 is coupled to the negative input of a comparator 104 included in the circuit 68. The positive input of the comparator 104 is coupled through a resistor R11 (preferably matched to the resistors R8-R10) to a hysteresis circuit comprised of a resistor R12 in parallel with a series resistor R13 and capacitor C2 and coupled at one end to the resistor R11 and the voltage reference +VR through a resistor R14, and at its other end to the output of the comparator 104.

The hysteresis circuit as above defined introduces both d-c and a-c hysteresis into the pulser output ($\overline{PO}$) signal as follows:

$$H_{d\text{-}c} = \frac{R14 \cdot \Delta PO}{R14 + R12}$$
$$H_{a\text{-}c} = \frac{R14 \cdot \Delta PO}{R14 + R13} \text{ , if } \frac{1}{\omega C2} << R13 << R12$$

Figure 6:
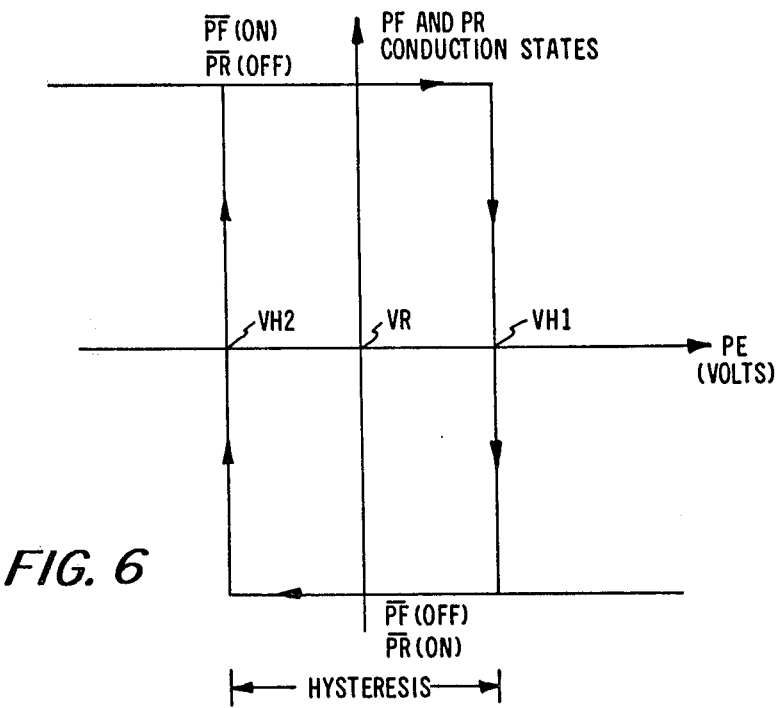
FIG. 6 is a waveform of the output of the pulse comparator shown in FIG. 2 in relation to the states of the $\overline{PF}$ and $\overline{PR}$ output signals from the overall pre-driver circuit shown in FIGS. 1 and 2.

The d-c hysteresis is used to avoid noise and the a-c hysteresis is used to reduce excessive power dissipation in the switching elements 44–50 (FIG. 2). A hysteresis waveform of the pulser output ($\overline{PO}$) signal relative to the conduction states of the $\overline{PF}$ and $\overline{PR}$ control signals is shown in FIG. 6.

Figure 7:
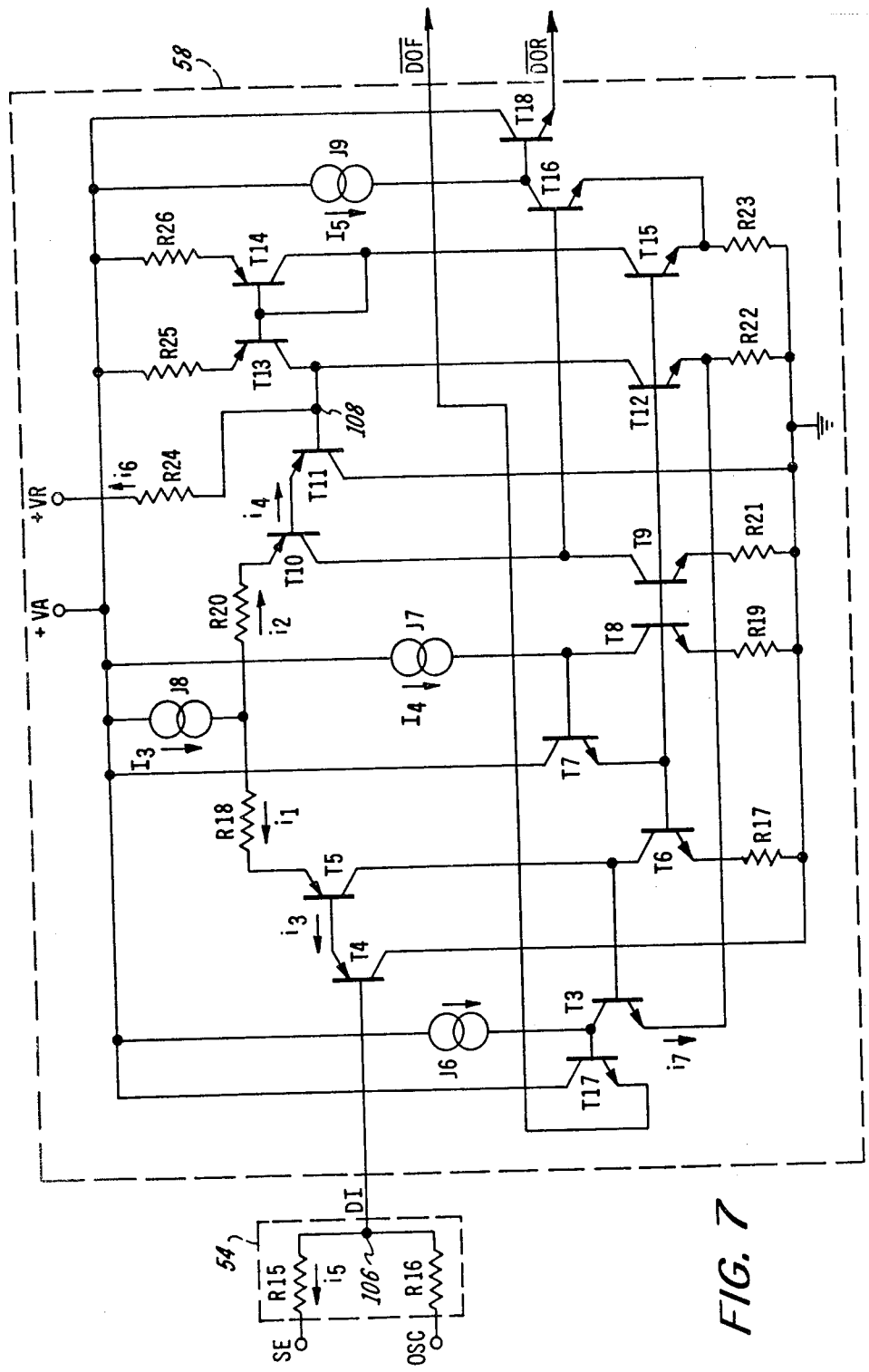
FIG. 7 is a schematic circuit diagram of the direction comparator and associated input summer shown in FIG. 2.

The summing circuit 54 and the direction comparator with driver hysteresis and deadband circuit 58 will now be described with reference to FIG. 7. The summing circuit 54 includes a junction 106 connected through a first resistor R15 to the servo controller 20 for receiving the SE signal therefrom, and through a second resistor R16 to the triangle wave generator 56 for receiving the OSC signal therefrom. The resultant direction input (DI) signal is applied to the base electrode of an input transistor T4 included in the circuit 58. As will be recalled, the primary functions of the circuit 58 are to (1) determine the direction of motor current flow, i.e., if the DI signal input is less than the reference voltage +VR, then the motor current flow is in the forward direction, and visa versa, and to (2) provide the deadband periods and hysteresis alluded to above and shown in FIGS. 8 and 15.

In terms of the specific circuit elements of the circuit 58, the collector electrode of the input transistor T4 is connected to ground and the emitter electrode is connected to the base electrode of a transistor T5. The collector electrode of transistor T5 is connected to the collector electrode of a transistor T6 and to the base electrode of a transistor T3. The emitter electrode of transistor T6 is grounded through a resistor R17 and the emitter electrode of transistor T3 is grounded through a resistor R22. The output signal $\overline{DOF}$ is developed at the emitter electrode of a transistor T17, the base electrode of which is connected to the collector electrode of transistor T3, which electrode is also connected through a current source J6 to the voltage source $+VA$. The collector electrode of transistor T17 is connected to voltage source $+VA$. The emitter electrode of transistor T5 is also coupled to the voltage source $+VA$ through a resistor R18 and a current source J8.

The base electrode of the transistor T6 is connected to the emitter electrode of a transistor T7 and to the base electrodes of four transistors T8, T9, T12 and T15. The collector electrode of transistor T7 is connected to the voltage source $+VA$ and the base electrode of transistor T7 is connected to the collector electrode of transistor T8 and through a current source J7 to the voltage source $+VA$. The emitter electrodes of each of the transistors T8, T9, T12 and T15 are grounded through respective resistors R19, R21, R22 and R13. The collector electrode of transistor T9 is connected to the base electrode of another output transistor T16 and to the collector electrode of a transistor T10. The emitter electrode of transistor T10 is connected through a resistor R20 and the current source J8 to the voltage source $+VA$.

The base electrode of the transistor T10 is connected to the emitter electrode of a transistor T11, the collector electrode of which is grounded. The base electrode of transistor T11 is connected through a resistor R24 to the reference voltage $+VR$ and to the collector electrodes of a transistor T12 and the transistor T12. The emitter electrode of transistor T13 is connected to the voltage source $+VA$ through the resistor R25, and the base electrode of transistor T13 is connected to both the base and collector electrodes of a transistor T14 and to the collector electrode of transistor T15. The emitter electrode of transistor T14 is connected to the voltage source $+VA$ through a resistor R26. The second output signal $\overline{DOR}$ is developed at the emitter electrode of an output transistor T18, whose base electrode is connected to collector electrode of transistor T16, which electrode is coupled through a current source J9 to the voltage source $+VA$. Lastly, the emitter electrode of transistor T16 is grounded through the resistor R23, and the collector electrode of transistor T18 is connected to voltage supply $+VA$.

Figure 8:
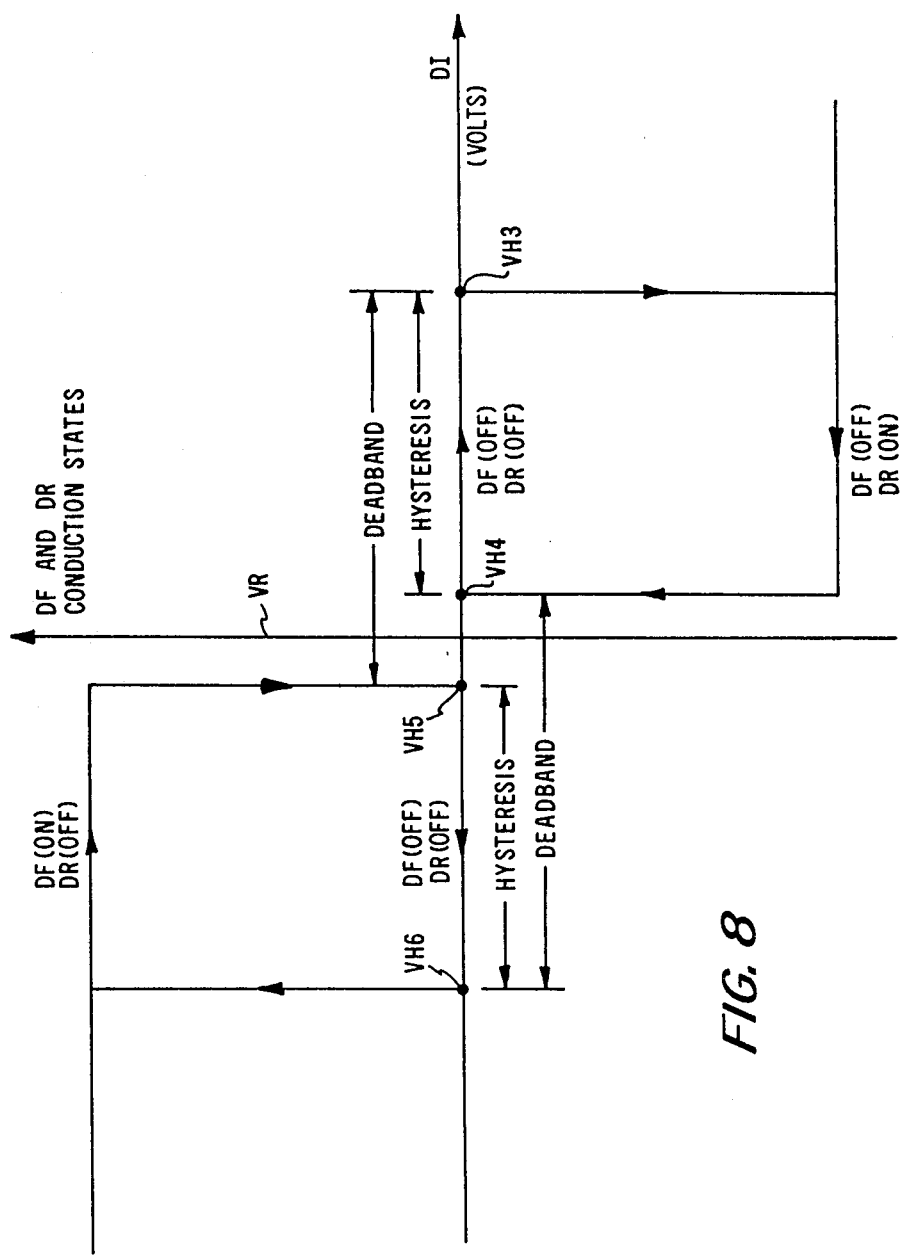
FIG. 8 is a waveform of the outputs of the direction comparator shown in FIG. 2 in relation to the states of the DF and DR output signals from the overall pre-driver circuit shown in FIGS. 1 and 2.
Figure 10:
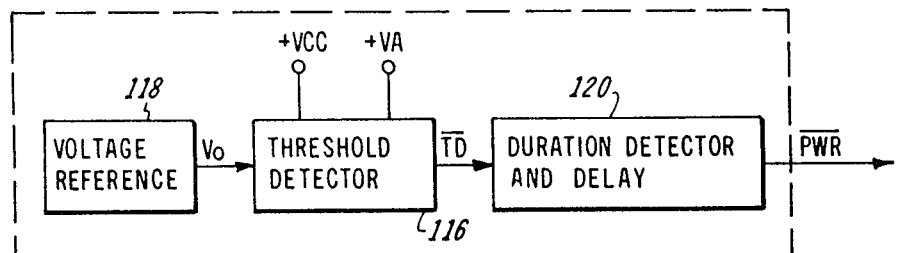
FIG. 10 is a block diagram representation of the power monitor circuit depicted in FIG. 2.

In operation, let us first assume the the input, DI, of network 58 is much larger than the reference voltage $+VR$, as well as the defined hysteresis and deadband voltage levels VH3, VH4, VH5 and VH6 (see FIGS. 8 and 15). In this case, the transistor T4 is turned off completely, as are the transistors T5 and T3. However, the transistors T10 and T11 are both on "hard". Additionally, the transistor T16 is turned on. Hence, the transistor T15 is cut off by the voltage generated by the product of current I5 and resistor R23. Therefore, the current source formed by transistor T13 is electrically disconnected from junction point 108. However, the current sink formed by transistor T12 demands $I_4/2$ (or $i_6$) from the junction point 108. This current can only be supplied by the reference voltage $+VR$ through resistor R24. Therefore, the voltage of junction point 108 is droped from $+VR$ to $VR - i_6.R_{24}$.

Since the transistor T16 is turned on, the transistor T18 is turned off. Hence, $\overline{DOR}$ is active (low) or the output, DR, of network 38 is high (on). At the same time, the transistor T3 is turned off, but the transistor T17 is turned on by the current source J6. Hence, the signal $\overline{DOF}$ is not active (high) of DF of network 38 is low (off). Therefore, the network 24 commands a current to the load (motor) network 16. The input, DI, of network 58 will then begin to decrease, until it reaches at the first trip point VH4. The voltage level of VH4 is defined as:

$$DI = (VR + i_6 R_{24}) - (R18.i_1 - R20.i_2) - (VBET5|_{i1} - VBET10|_{i2}),$$

and $$VH4 = DI \text{ when } i_6 < 0 \text{ and } i_1 = \tfrac{1}{2}i_2.$$

where $VBET5|_{i1}$ and $VBET10|_{i2}$ are respectively the base to emitter voltage levels of transistors T5 and T10 at currents $i_1$ and $i_2$.

At the trip point VH4, DR is turned from "ON" to "OFF". Hence after this point, both DR and DF are in "OFF" states. It can also be considered as the transition of load current from reverse direction into the deadband region.

In the deadband region, both transistors T3 and T16 are turned off. Hence the current source T13 and the current sink T12 are both on. Then since $i_6 = 0$ the voltage at junction point 108 is equal to the reference voltage $+VR$.

If the voltage level of DI continuously decreases, then it can reach the second trip point VH6. The voltage level of VH6 is defined as:

$$VH6 = DI \text{ when } i_6 = 0 \text{ and } i_1 = 2i_2$$

At this trip point, the transistor T3 begins to turn on; hence, the transistor T17 is going to turn off. Therefore, the output $\overline{DOF}$ of network 58 is active (low) or the output DF of network 38 is high (on). However, the output DR stays low (off). This point is also the transition point from the deadband region into the forward direction of load current.

Similarly, when DI is much smaller than the reference voltage $+VR$ as well as the defined hysteresis and deadband (see FIG. 8), the output DF of network 38 is high (on) but the DR is low (off). Thetrip point from the states DF (on) and DR (off) into deadband or both DR and DR are off is the voltge level VH5. It can be expressed as follows:

$$VH5 = DI \text{ when } i_6 > 0 \text{ and } i_1 = 2i_2$$

The trip point when it is out of deadband (both DR and DR are off) to the states DF(OFF)/DR(ON) is defined as the voltage level VH3. It is expressed as follows:

$$VH3 = DI \text{ when } i_6 = 0 \text{ and } i_1 = \tfrac{1}{2}$$

The preferred values of VH3 through VH6 and VR are as follows:

$$VH3 = +12.75V$$

$$VH4 = +12.55V$$

$$VH5 = +12.45V$$

$$VH6 = +12.25V$$

$V_R = +12.50V$

Figure 9:
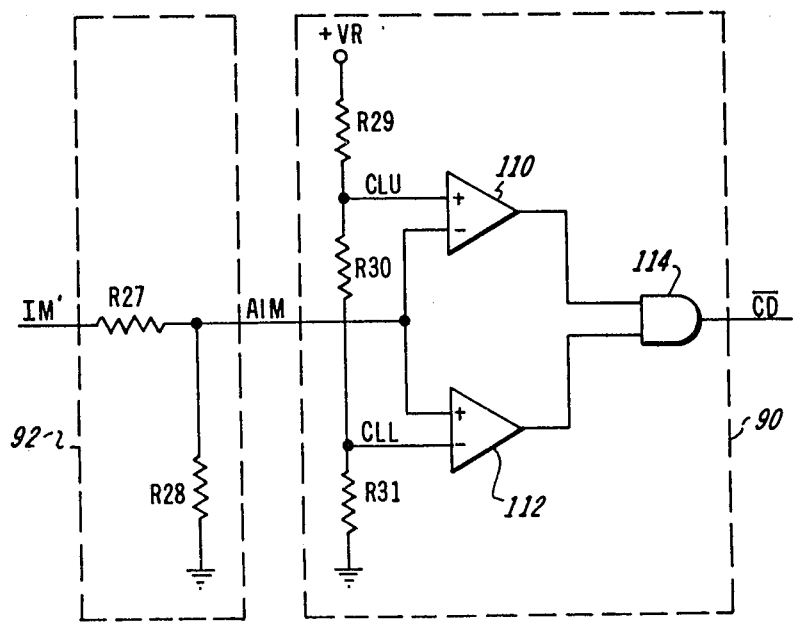
FIG. 9 is a schematic circuit diagram of the attenuator and current limiter circuits shown in FIG. 2.

Reference is now had to FIG. 9, where the attenuator 92 and current limiter circuit 99 depicted in FIG. 2 will be described. Referring first to the attenuator 92, it preferably includes a voltage divider defined by resistors R27 and R28, both preferably 10KΩ resistors. More specifically, the IM' current feedback signal from the current sense amplifier 62 (FIG. 2) is applied through the voltage divider attenuator 92, which divides the amplitude of IM' by two to arrive at AIM, to the negative input of an upper limit comparator 110 and the positive input of a lower limit comparator 112. The positive input of the comparator 110 is coupled through a resistor R29 (preferably 6.25 KΩ) to the reference voltage +VR, and through series resistors R30 (preferably 50 KΩ) and R31 (preferably 6.25 KΩ) to ground. The negative input of comparator 112 is coupled through the resistor R31 to ground and through the series resistors R30 and R29 to reference voltage +VR. Desirably, therefore, an upper current limit threshold voltage (CLU), preferably 11.25 volts, is defined at the positive input of comparator 110, and a lower current limit threshold voltage (CLL), preferably 1.25 volts, is defined at the negative terminal of the comparator 112. The outputs of both comparators are coupled to respective inputs of an AND-gate 114, the output of which develops the current disable not ($\overline{CD}$) signal that is applied to the motor enable gate 84 (FIG. 2).

In operation, when the voltage level of the AIM signal exceeds the upper threshold level CLU, the output of the comparator 110 goes low, which causes the $\overline{CD}$ not signal to be low (true). Similarly, when the voltage level of the AIM signal is less than the lower threshold level CLL, the output of comparator 112 will go low, thereby also causing a true (low) $\overline{CD}$ signal at the output of gate 114.

It will thus be appreciated that if the current feedback signal AIM falls outside the range defined by the threshold levels CLU and CLL, the current through the motor 16 will be virtually instantaneously inhibited through the disabling action of a true (low) $\overline{CD}$ signal on the gate 84 and gates 76-82 (FIG. 2). It is not necessary to rely upon current feedback through the relatively slower servo controller 20 to achieve a motor current disable condition.

Reference is now had to FIGS. 10-14 where the preferred power monitor circuit 94 disclosed in FIG. 2 will be described. Referring first to the block diagram representation of FIG. 10, the power monitor circuit 94 includes a threshold detector 116 that is adapted to receive the voltage source +VA alluded to above (preferably +32 volts), as well as another voltage source +VCC (preferably +5 volts) that is used to provide power to various other control circuits included in the control system of FIG. 1. The purpose of the threshold detector circuit 116 is to detect whenever either VA of VCC fall below predetermined threshold levels, i.e., a "glitch" has occurred in either power source, and to generate a true (low) threshold detect not ($\overline{TD}$) signal upon such event. The predetermined threshold levels are established by means of a reference voltage $V_o$ supplied to the detector circuit 116 in a manner to be described below. The reference voltage is generated by a voltage reference generator 118.

The $\overline{TD}$ output signal from the threshold detector is applied to a duration detector and delay circuit 120. The circuit 120 has a number of functions. First, upon initial "power-on", it holds a $\overline{PWR}$ output signal true (low) for a first predetermined period of time e.g., 50 ms, in order to allow the control system of FIG. 1, and particularly the processor 26 thereof to stabilize. Second, it examines each glitch in the power supply voltages VA and VCC to see whether or not it exceeds a second predetermined period of time, e.g., 500 ns. If so, it generates a true $\overline{PWR}$ signal. Third, when a true $\overline{PWR}$ signal occurs upon detection of a glitch of longer duration than 500 ns, once the glitch dissipates, the circuit 120 maintains the $\overline{PWR}$ signal true for at least a third predetermined time period, e.g., at least 1 us. The second time period is established to avoid sensitivity to electrostatic noise, while the third time period is to insure that a glitch doesn't develop in the overall system by failing to allow proper stabilization following dissipation of the power supply glitch.

Figure 11:
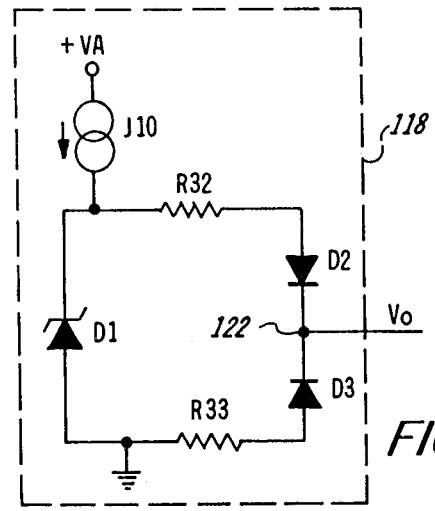
FIG. 11 is a schematic circuit diagram of the voltage reference circuit depicted in FIG. 10.

Referring now to FIG. 11, the voltage reference circuit 118 preferably includes a current source J10 connected between voltage source +VA and ground through a parallel circuit comprised of a zener diode D1 on one leg and the series connection of a resistor R32, diode D2, diode D3 and resistor R34 on the other leg. The current source is preferably 200 ua, the resistor R32 is preferably 18.6 KΩ and the resistor R33 is preferably 11.8 KΩ. The voltage reference $V_o$ is developed at the junction 122 between the diodes D2 and D3 and is desirably approximately 2.3 volts. This voltage level basically establishes a threshold level of both power sources +VA and +VCC in a manner to be described below.

Figure 12:
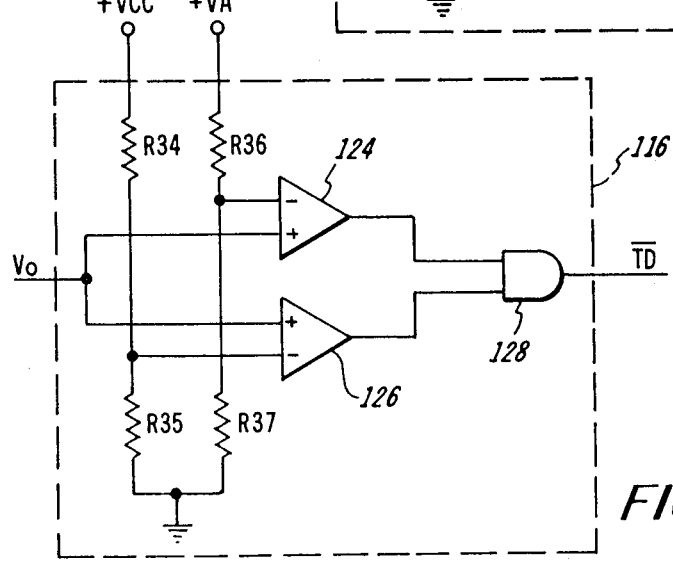
FIG. 12 is a schematic circuit diagram of the threshold detector circuit shown in FIG. 10.

The threshold detector 116 is shown in FIG. 12 and includes a first comparator 124 having its positive input connected to the voltage reference generator for receiving the voltage reference $V_o$ and its negative input connected to a voltage divider comprised of series resistors R36 and R37 connected between voltage source +VA and ground. The value of the resistors R36 and R37 is such that when the voltage source +VA (32 volts) drops to 26 volts, the voltage at the negative input of the comparator 124 will be 2.3 volts, i.e., the threshold level established by the reference $V_o = 2.3$ volts. The reference $V_o$ is also applied to the positive input of another comparator 126, whose negative input is connected to another voltage divider comprised of series resistors R34 and R35 connected between the voltage source +VCC and ground. Again, the value of the resistors R34 and R35 is such that when the voltage source +VCC (5 volts) drops to 4.5 volts, the voltage at the negative input of the comparator 126 will be 2.3 volts. Accordingly, if the voltage source +VA drops below 26 volts, the output of comparator 124 will go low, whereas if the voltage source +VCC drops below 4.5 volts, the output of the comparator 126 will go low.

The outputs of comparators 124 and 126 are connected to respective inputs of an AND-gate, the output of which develops the $\overline{TD}$ signal alluded to above that is connected to the duration detector and delay circuit 120. Thus, if either or both power supply voltages drop below their respective threshold levels, the $\overline{TD}$ signal will be true (low), signifying that event.

Figure 13:
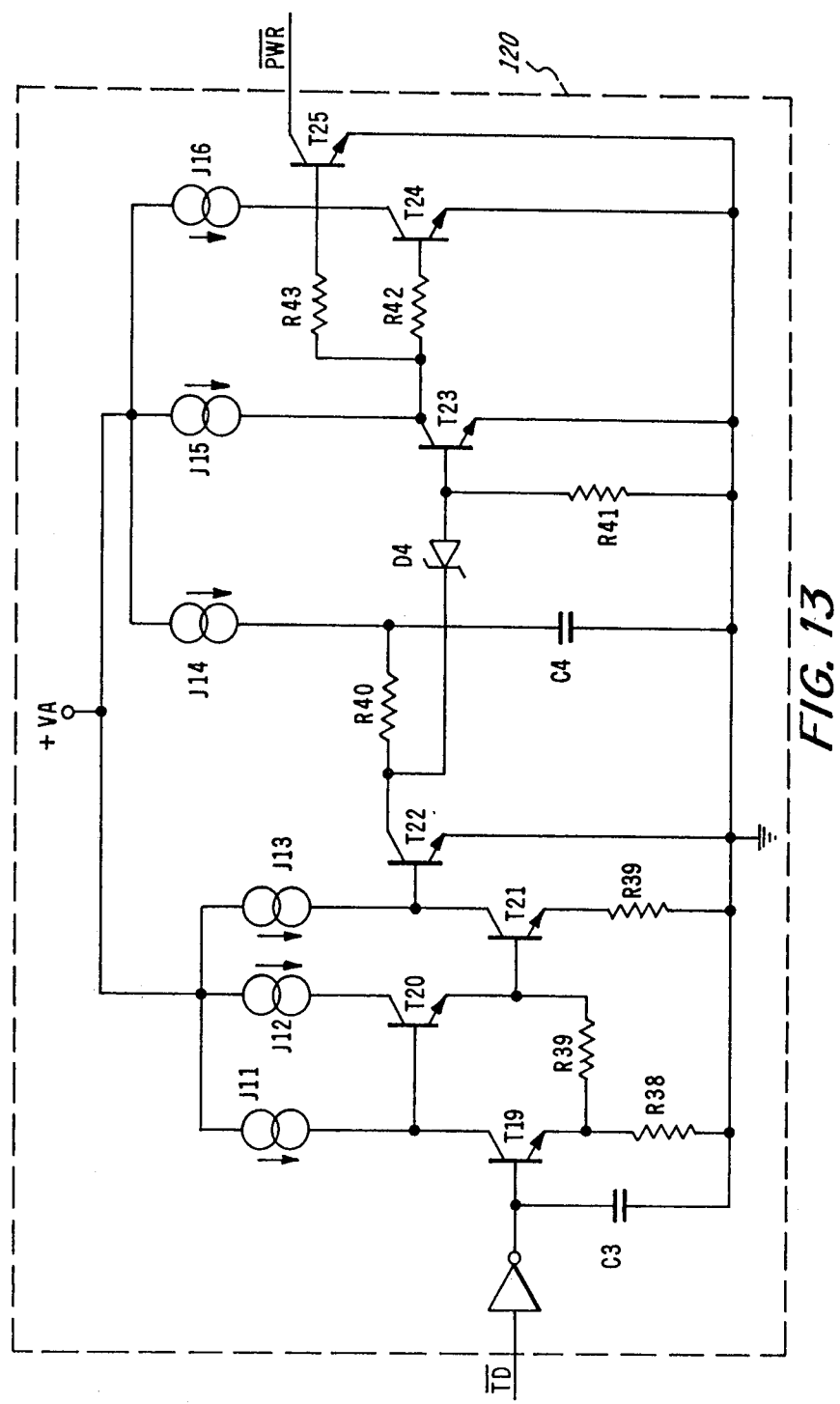
FIG. 13 is a schematic circuit diagram of the duration detector and delay circuit shown in FIG. 10.

Referring now to FIG. 13, the duration detector and delay circuit 120 will be described. As shown, the circuit 120 includes an inverter 130 for coupling the TD signal as $\overline{TD}$ to the base electrode of a transistor T19 and to ground through a capacitor C3. The collector electrode of the transistor T19 is connected through a current source J11 to the voltage source +VA and is also connected to the base electrode of another transistor T20. The emitter electrode of the transistor T19 is grounded through a resistor R38, and the emitter electrode of the transistor T20 is grounded through a resistor R39 and the resistor R38. The emitter electrode of the transistor T20 is also connected to the base electrode of another transistor T21, and the collector electrode of transistor T20 is connected through a current source J12 to the voltage source +VA.

The emitter electrode of the transistor T21 is connected to ground through a resistor R39 and the collector electrode is connected through a current source J13 to the voltage source +VA. The collector electrode of transistor T21 is also connected to the base electrode of another transistor T22, the emitter electrode of which is grounded. The base electrode of transistor T22 is connected through a resistor R40 and a capacitor C4 to ground, and is also connected through the resistor R40 and a current source J14 to the voltage source +VA. The collector electrode of transistor T22 is further connected to the base electrode of another transistor T23 through a zener diode D4.

The base electrode of transistor T23 is connected to ground through a resistor R41. The emitter electrode of transistor T23 is grounded and the collector electrode is connected through a current source J15 to voltage source +VA. The collector electrode of transistor T23 is also connected to the base electrode of another transistor T24 through a resistor R42, and to the base electrode of an output transistor T25 through another resistor R43. The emitter electrodes of both transistors T24 and T25 are gounded and the collector electrode of transistor T24 is connected through a current source J16 to the source voltage +VA. The output signal $\overline{PWR}$ of the circuit 120 is developed at the collector electrode of the transistor T25.

In operation, when $\overline{TD}$ is low, signifying that either of the two voltage sources drops below their predetermined reference potentials, then the capacitor C3 will be charged. The time required to charge capacitor C3 to a voltage such that transistor T19 will turn on is:

$$t_c = \frac{C3 \cdot \Delta V}{I}$$

In the preferred embodiment, the value of C3 is $8 \times 10^{-12}$ farad and the value of the charging current is 20 ua. Further, $\Delta V = V_{BET19} + V_{ET19}$, i.e., (0.65 + 0.47) in the preferred embodiment. Accordingly, $t_c$ equals 448 ns (approximately 500 ns). This is also the time duration required before transistor T20 can be turned off, as well as transistor T19 being turned on.

Once the transistor T20 has been turned off, transistor T21 will be off too. Consequently, transistor T22 will turn on. The capacitor C4 then begins to discharge through resistor R40 to ground. Before capacitor C4 started to discharge, it was charged by current source J14 (preferably 32 ua) to a voltage set by the zener diode D4 and the base-emitter voltage of transistor T23, or 8.3 volts in the preferred embodiment. During this time, the transistor T23 is turned off, but the transistor T25 is turned on, so that the $\overline{PWR}$ signal developed at the collector electrode of transistor T25 is true (low). This will cause the gate 84 (FIG. 2) to apply a low MOTOR ENABLE signal to the gates 76-82, thereby disabling same.

With respect to the hysteresis delay following dissipation of a glitch, once the 500 ns glitch has dissipated from the supply voltage VA or VCC, the transistor T22 turns off again. Then, the current source J14 begins to charge the capacitor C4. The time required to charge it back to 8.3 volts is:

$$\Delta t = \frac{\Delta Q}{J24},$$

where $\Delta Q$ is the charge expelled from the capacitor C4 during discharge in response to detection of a glitch in one of the power supplies. By way of example, assume $\Delta Q = 8.13 \times 10^{-10}$ coul. Then, with $J24 = 32 \times 10^{-6}$ amps, the recharge time = 25 us, which is greater that 1 us.

Figure 14:
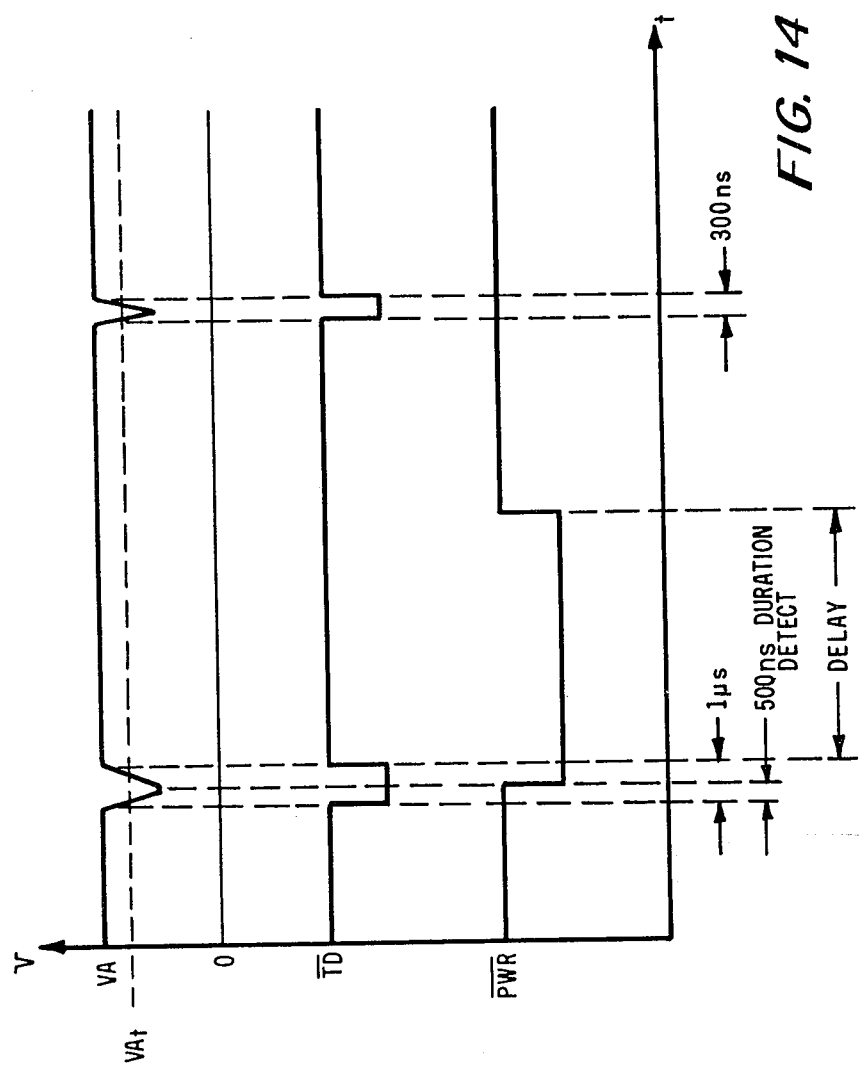
FIG. 14 are waveforms of the voltage source VA, threshold detector output $\overline{TD}$ and power monitor output $\overline{PWR}$.

FIG. 14 is a timing diagram showing the waveforms of signals VA, $\overline{TD}$ and $\overline{PWR}$ with a glitch (spike) below the 26 volts threshold voltage ($VA_t$) in the voltage source +VA. As shown, the glitch lasts for 1 us in the example, which is greater than the 500 ns minimum interval. Accordingly, the $\overline{PWR}$ signal will go true at the 500 ns point into the 1 us glitch interval below $VA_t$. It is delayed by the hysteresis delay (e.g., 25 us) from going high again following dissipation of the glitch, as shown. It will be appreciated that the delay time of 25 us is only one example. The exact duration of true time delay is dependent upon the value of $\Delta Q$ in the above equation. Further, during initial power on, when C4 is completely discharged, the charge time of such capacitor will cause $\overline{PWR}$ to stay low for about 50 ms, which is preferred to allow the control system to stabilize.

Although the invention has been described with respect to a presently preferred embodiment, it will be appreciated by those skilled in the art that various modifications, substitutions, etc. may be made without departing from the spirit and scope of the invention as defined in and by the following claims.

What is claimed is:

1. A power amplifier for controlling the current flow through a load, comprising:
   a plurality of switching elements connected in bridge fashion with said load and a first predetermined power source for coupling the load across alternate output terminals of said first predetermined power source in accordance with the levels of a plurality of control signals respectively applied to said plurality of switching elements;
   generating means operatively coupled to a second predetermined power source for generating said control signals;
   coupling means capable when enabled of coupling each of said control signals from said generating means to the respective switching element for controlling same;
   power monitor means for comparing the voltage level of said second predetermined power source with a predetermined reference potential and for generating a current disable signal when said voltage level is less than said predetermined reference potential; and
   disable means coupled to said power monitor means and responsive to said current disable signal for disabling said coupling means whereby further current flow through said load is inhibited.

2. The power amplifier of claim 1, wherein said power monitor means comprises:

a threshold detector including means for comparing the voltage level of said second predetermined power source with said predetermined reference potential and for generating a detect disable signal when and for so long as said voltage level is less than said predetermined reference potential; and a duration detector coupled to said threshold detector and responsive to said detect disable signal for detecting the time duration of said detect disable signal and for generating said current disable signal if the duration of said detect disable signal exceeds a first predetermined time duration.

3. The power amplifier of claim 1 or claim 2, wherein said power monitor means comprises means for maintaining said current disable signal true for at least a second predetermined delay interval following return of said voltage level to a level equal to or greater than said predetermined reference potential.

4. The power amplifier of claim 3, wherein said power monitor means further comprises means for maintaining said current disable signal true for a third predetermined delay interval upon initial turn on of said second predetermined power source.

* * * * *